United States Patent
Onishi (10) Patent No.: US 9,966,248 B2
(45) Date of Patent: May 8, 2018

(54) SEMICONDUCTOR MANUFACTURING APPARATUS AND SEMICONDUCTOR MANUFACTURING METHOD

(71) Applicant: Toshiba Memory Corporation, Minato-ku (JP)

(72) Inventor: Takahiro Onishi, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 87 days.

(21) Appl. No.: 14/643,753

(22) Filed: Mar. 10, 2015

(65) Prior Publication Data
US 2016/0196995 A1    Jul. 7, 2016

Related U.S. Application Data

(60) Provisional application No. 62/099,660, filed on Jan. 5, 2015.

(51) Int. Cl.
| | |
|---|---|
| *G01R 31/00* | (2006.01) |
| *H01L 21/02* | (2006.01) |
| *H01L 21/67* | (2006.01) |
| *H01L 21/687* | (2006.01) |
| *H01L 21/32* | (2006.01) |

(52) U.S. Cl.
CPC .. *H01L 21/02021* (2013.01); *H01L 21/02115* (2013.01); *H01L 21/32* (2013.01); *H01L 21/67259* (2013.01); *H01L 21/6875* (2013.01); *H01L 21/68742* (2013.01)

(58) Field of Classification Search
CPC ........... H01L 21/67259; H01L 21/6831; H01L 21/6833; H01J 2237/3348; H01J 2229/8631; C23C 16/4585

USPC ..... 216/59, 60; 438/731; 156/345.3, 345.31, 156/345.51, 345.54
See application file for complete search history.

(56) References Cited

U.S. PATENT DOCUMENTS

| | | | |
|---|---|---|---|
| 6,277,198 B1 | 8/2001 | Yao et al. | |
| 6,440,219 B1 * | 8/2002 | Nguyen | C23C 16/4585 118/503 |
| 6,555,164 B1 * | 4/2003 | Yudovsky | H01L 21/68 414/214 |

(Continued)

FOREIGN PATENT DOCUMENTS

| | | |
|---|---|---|
| JP | 2001-73135 | 3/2001 |
| JP | 2007-324486 | 12/2007 |
| JP | 2008-311475 | 12/2008 |

OTHER PUBLICATIONS

"Centroids and Center of Gravity" via http://www.mathalino.com/reviewer/engineering-mechanics/centroids-and-centers-gravity ; 8 pages; No date available.*

*Primary Examiner* — Binh X Tran
(74) *Attorney, Agent, or Firm* — Oblon, McClelland, Maier & Neustadt, L.L.P.

(57) ABSTRACT

In one embodiment, a semiconductor manufacturing apparatus includes a wafer setting module on which a wafer is to be set. The apparatus further includes a cover module configured to cover a portion of the wafer set on the wafer setting module. The apparatus further includes a position controller configured to detect a position of the wafer set on the wafer setting module and control a position of the cover module based on the detected position of the wafer.

11 Claims, 7 Drawing Sheets

(56) References Cited

U.S. PATENT DOCUMENTS

| | | | | |
|---|---|---|---|---|
| 7,706,907 B2* | 4/2010 | Hiroki | ................... | H01L 21/681 414/416.03 |
| 2004/0003780 A1* | 1/2004 | Yudovsky | ........... | C23C 16/4585 118/728 |
| 2007/0091291 A1* | 4/2007 | Phillips | ................... | G03F 7/707 355/75 |
| 2011/0283940 A1* | 11/2011 | Jhong | .................... | G03F 7/162 118/668 |

* cited by examiner

SEMICONDUCTOR MANUFACTURING APPARATUS AND SEMICONDUCTOR MANUFACTURING METHOD

CROSS REFERENCE TO RELATED APPLICATION

This application is based upon and claims the benefit of priority from the prior U.S. Provisional Patent Application No. 62/099,660 filed on Jan. 5, 2015, the entire contents of which are incorporated herein by reference.

FIELD

Embodiments described herein relate to a semiconductor manufacturing apparatus and a semiconductor manufacturing method.

BACKGROUND

In a case of forming a film on a wafer, if the film remains at a bevel (end portion) of the wafer, the film remaining at the bevel may become a dust source. An example of such a film is an amorphous carbon film formed by plasma enhanced chemical vapor deposition (PECVD). In some cases, the film is formed on the wafer in a state that the bevel is covered with a cover ring in order to prevent the film from being formed at the bevel. This enables the film to be formed on a surface of the wafer excluding the bevel. This is referred to as mask deposition. In these cases, when the wafer moves on a stage, there may be a problem that a positional relation between the bevel and the cover ring becomes unstable and therefore a position of the mask deposition becomes unstable.

In some cases, after the film is formed on the surface of the wafer including the bevel, the film is removed from the bevel in a state that a portion excluding the bevel is covered with an upper cover. This is referred to as bevel etching. According to the bevel etching, the film can be formed on the surface of the wafer excluding the bevel as similar to the mask deposition. In these cases, when the wafer moves on a stage, there may be a problem that a positional relation between the bevel and the upper cover becomes unstable and therefore a position of the bevel etching becomes unstable.

DETAILED DESCRIPTION

Embodiments will now be explained with reference to the accompanying drawings.

In one embodiment, a semiconductor manufacturing apparatus includes a wafer setting module on which a wafer is to be set. The apparatus further includes a cover module configured to cover a portion of the wafer set on the wafer setting module. The apparatus further includes a position controller configured to detect a position of the wafer set on the wafer setting module and control a position of the cover module based on the detected position of the wafer.

First Embodiment

Figure 1A:
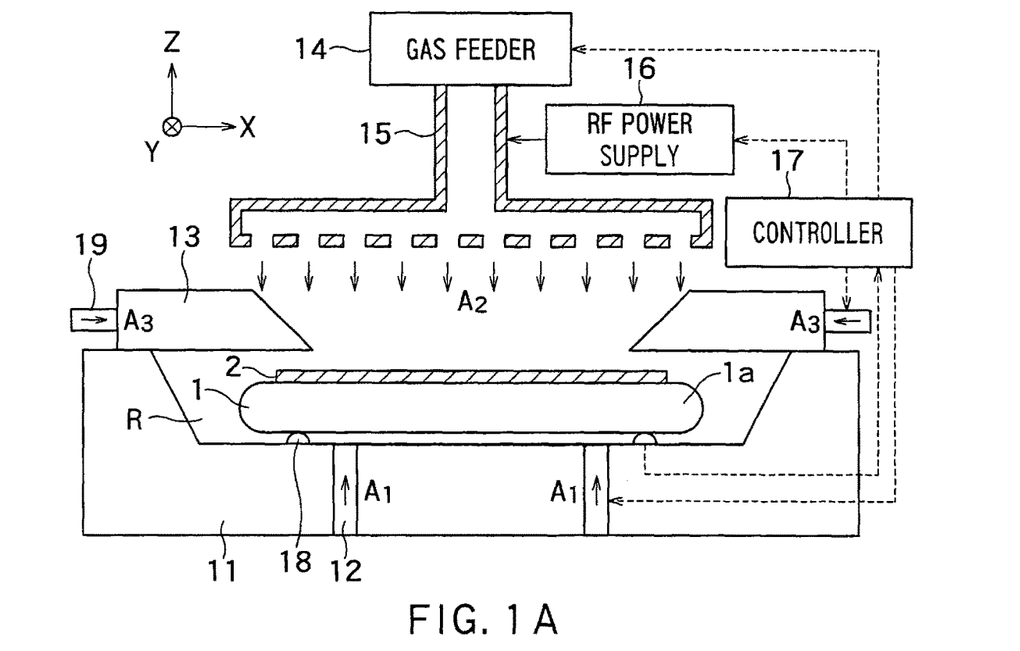
FIGS. 1A to 1C are a sectional view and top views illustrating a configuration of a semiconductor manufacturing apparatus of a first embodiment.
Figure 1B:
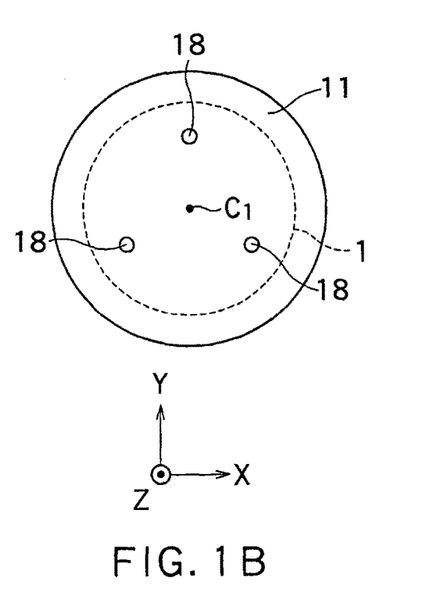
Figure 1C:
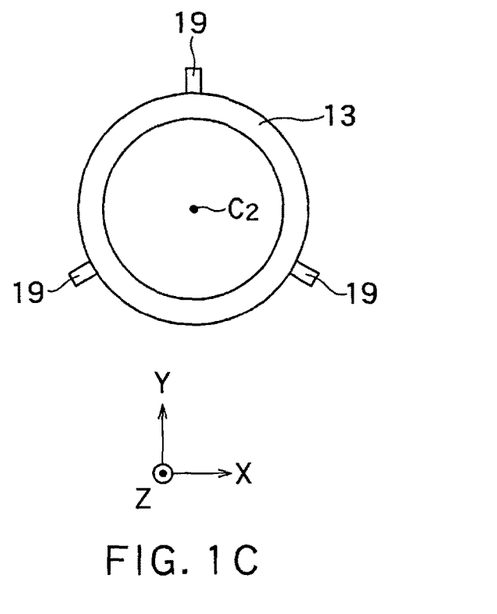

FIGS. 1A to 1C are a sectional view and top views illustrating a configuration of a semiconductor manufacturing apparatus of a first embodiment.

The semiconductor manufacturing apparatus of the present embodiment includes, as illustrated in FIGS. 1A to 1C, a stage 11, a plurality of lift pins 12, a cover ring 13, a gas feeder 14, an upper electrode 15, a radio frequency (RF) power supply 16, a controller 17, a plurality of weight sensors 18, and a plurality of adjustment pins 19.

FIG. 1A is the sectional view illustrating the configuration of the semiconductor manufacturing apparatus of the present embodiment. FIG. 1B is the top view illustrating shapes of the stage 11 and the weight sensors 18. FIG. 1C is the top view illustrating shapes of the cover ring 13 and the adjustment pins 19. The stage 11 and the cover ring 13 are respectively examples of a wafer setting module and a cover module. The controller 17, the weight sensors 18 and the adjustment pins 19 are an example of a position controller. The weight sensors 18 and the adjustment pins 19 are respectively examples of a weight detector and a pressing member. The gas feeder 14, the upper electrode 15, the RF power supply 16 and controller 17 are an example of a film forming module. In FIG. 1B, illustration of the lift pins 12 is omitted for convenience in drawing.

The semiconductor manufacturing apparatus of the present embodiment can form a film 2 on a wafer 1 as illustrated in FIG. 1A. An example of the wafer 1 is a semiconductor wafer such as a silicon wafer. An example of the film 2 is an amorphous carbon film. An exemplary processing to form the film 2 is deposition processing such as PECVD. The film 2 may be directly formed on the wafer 1, or may be formed on the wafer 1 via another layer. A reference sign 1$a$ indicates a bevel of the wafer 1. The bevel 1$a$ of the wafer 1 is an example of an end portion of the wafer 1.

[Stage 11]

The stage 11 is used to set the wafer 1. FIGS. 1A and 1B illustrate the wafer 1 set on an upper side of the stage 11 via the weight sensors 18. A point $C_1$ in FIG. 1B indicates a center of the wafer 1 set on the stage 11.

FIGS. 1A to 1C illustrate X-direction and Y-direction parallel to an upper face of the stage 11 and orthogonal to each other, and Z-direction orthogonal to the upper face of the stage 11. In the present specification, +Z-direction is defined as an upward direction, and −Z-direction is defined as a downward direction. For example, the positional relation between the stage 11 and the cover ring 13 is expressed as that the stage 11 is positioned under the cover ring 13. The −Z-direction of the present embodiment may conform to a gravity direction or may not conform to the gravity direction.

[Lift Pins 12]

The lift pins 12 are disposed in the stage 11. The lift pins 12 can be vertically moved as indicated by arrows $A_1$, thereby achieving to lift or lower the wafer 1 on the stage 11. In the semiconductor manufacturing apparatus of the present embodiment, the wafer 1 may be lifted or lowered relative to the stage 11 by vertically moving the stage 11 while fixing positions of the lift pins 12.

[Cover Ring 13]

The cover ring 13 is disposed on an outer frame of the stage 11. The cover ring 13 is used to cover a portion of the wafer 1 set on the stage 11, more specifically, used to cover the bevel 1a of the wafer 1. The cover ring 13 of the present embodiment has a ring shape to cover the bevel 1a of the wafer 1.

A point $C_2$ in FIG. 1C indicates a center of the cover ring 13. An inner periphery and an outer periphery of the cover ring 13 of the present embodiment are ring-shaped. However, at the inner periphery of the cover ring 13 of the present embodiment, a projected portion not illustrated is provided to mask a notch portion of the wafer 1. According to the present embodiment, an inner peripheral radius of the cover ring 13 is set smaller than a radius of the wafer 1, and an outer peripheral radius of the cover ring 13 is set larger than the radius of the wafer 1. The radius of the wafer 1 is, for example, 150 mm.

The semiconductor manufacturing apparatus of the present embodiment forms the film 2 on the wafer 1 in the state that the bevel 1a of the wafer 1 is covered with the cover ring 13 as illustrated in FIG. 1A. This can prevent the film 2 from being formed on the bevel 1a. In this manner, the semiconductor manufacturing apparatus of the present embodiment can perform mask deposition for the wafer 1.

The stage 11 of the present embodiment includes a play area R in the vicinity of the bevel 1a of the wafer 1 in order to facilitate conveyance of the wafer 1. Therefore, because of the play area R, the wafer 1 of the present embodiment may move on the stage 11. Furthermore, the center $C_1$ of the wafer 1 of the present embodiment may be deviated from a center of the stage 11 because of the play area R. In such cases, the positional relation between the bevel 1a and the cover ring 13 becomes unstable, and there may be a problem that the position of mask deposition may become unstable. However, according to the present embodiment, the above problem may be solved by a method described later.

[Gas Feeder 14, Upper Electrode 15, RF Power Supply 16]

The gas feeder 14, upper electrode 15, and RF power supply 16 supply plasma to the wafer 1 set on the stage 11 as indicated by arrows $A_2$, and form the film 2 on the wafer 1 by the plasma.

The gas feeder 14 supplies a source gas of the plasma at the time of forming the film 2 on the wafer 1. Examples of the source gas are hydrocarbon gases such as a methane ($CH_4$) gas, an acetylene ($C_2H_2$) gas, and a propylene ($C_3H_6$) gas. These hydrocarbon gases are usable at the time of forming the amorphous carbon film as the film 2, for example.

The upper electrode 15 and a lower electrode not illustrated disposed in the stage 11 function together as a pair of electrodes to generate plasma. The upper electrode 15 of the present embodiment is connected to the gas feeder 14 and includes a plurality of gas supply ports at its lower face. On the other hand, the lower electrode of the present embodiment also functions as a heater to heat the wafer 1.

The source gas is supplied to above the wafer 1 from the plurality of gas supply ports provided at the lower face of the upper electrode 15. At this point, the RF power supply 16 applies high-frequency voltage between the upper electrode 15 and the lower electrode. As a result, the source gas is converted to plasma, and the film 2 is formed on the wafer 1. The semiconductor manufacturing apparatus of the present embodiment may include a matching box for adjusting impedance between the RF power supply 16 and a load impedance.

[Controller 17]

The controller 17 controls various kinds of operation of the semiconductor manufacturing apparatus. The controller 17 controls, for example, vertical movement of the lift pins 12, source gas supply from the gas feeder 14, application of the high-frequency voltage by the RF power supply 16 and the like.

The controller 17 can further detect a position of the wafer 1 set on the stage 11 and control a position of the cover ring 13 based on the detected position of the wafer 1. The controller 17 of the present embodiment detects the position of the wafer 1 based on output signals from the weight sensors 18. Furthermore, the controller 17 of the present embodiment controls the position of the cover ring 13 by using the adjustment pins 19. The above control by the controller 17 will be described in detail later.

[Weight Sensors 18]

The weight sensors 18 are disposed on the upper face of the stage 11. Therefore, the wafer 1 of the present embodiment is set on the stage 11 via the weight sensors 18. Each of the weight sensors 18 detects the weight of the wafer 1, and outputs a signal including the detected weight to the controller 17.

FIG. 1B illustrates three weight sensors 18 disposed on the upper face of the stage 11. The weight sensors 18 of the present embodiment are positioned at a same distance from the center of the stage 11 at 120 degrees intervals. The distance between the center of the stage 11 and the weight sensors 18 is set smaller than the radius of the wafer 1. Therefore, the wafer 1 can be placed on the weight sensors 18. The number of the weight sensors 18 of the present embodiment may be other than three.

The controller 17 can detect (calculate) a position of a gravity center of the wafer 1 based on the weights of the wafer 1 detected by the weight sensors 18. In the case where the semiconductor manufacturing apparatus of the present embodiment includes N pieces of weight sensors 18, the gravity center $x_G$ of the wafer 1 can be calculated by a following Formula (1).

$$x_G = (m_1 x_1 + m_2 x_2 + \ldots + m_N x_N)/(m_1 + m_2 + \ldots + m_N) \qquad (1)$$

Note that reference signs $x_1, x_2, \ldots, x_N$ indicate coordinate vectors of first to Nth weight sensors 18 respectively. These coordinate vectors are, for example, two dimensional coordinate vectors including X-components and Y-components. The coordinate components of the wafer 1 have a unit of, for example, mm (millimeter).

Furthermore, reference signs $m_1, m_2, \ldots, m_N$ indicate weights of the wafer 1 detected by the first to Nth weight sensors 18 respectively. The wafer 1 has a unit of the weight, for example, g (gram).

The controller 17 of the present embodiment preliminarily holds coordinate data of the weight sensors 18 in a storage. Furthermore, the controller 17 of the present embodiment calculates the position of the gravity center of the wafer 1 based on the weights of the wafer 1 detected by the weight sensors 18 and the coordinate data of the weight sensors 18 held in the storage.

The weight sensors 18 of the present embodiment may be disposed at tips of the lift pins 12 or the inside of the lift pins 12.

[Adjustment Pins 19]

The adjustment pins 19 contact the outer periphery of the cover ring 13. The adjustment pins 19 are used to adjust the position of the cover ring 13.

FIG. 1C illustrates three adjustment pins 19 contacting the outer periphery of the cover ring 13. These adjustment pins 19 of the present embodiment are disposed at 120 degrees intervals. The number of the adjustment pins 19 of the present embodiment may be other than three.

The controller 17 of the present embodiment controls the position of the cover ring 13 based on the detected position of the gravity center of the wafer 1. More specifically, the controller 17 moves the cover ring 13 such that the center $C_2$ of the cover ring 13 matches the center (gravity center) $C_1$ of the wafer 1. At this point, the controller 17 drives the adjustment pins 19 as indicated by arrows $A_3$, and the position of the cover ring 13 can be controlled by pushing the cover ring 13 with the adjustment pins 19.

As described above, the controller 17, the weight sensors 18 and the adjustment pins 19 of the present embodiment detect the position of the wafer 1 set on the stage 11, and control the position of the cover ring 13 based on the detected position of the wafer 1.

Therefore, according to the present embodiment, even when the wafer 1 is moved on the stage 11 or the center $C_1$ of the wafer 1 is deviated from the center of the stage 11, the positional relation between the bevel 1a and the cover ring 13 can be optimized by moving the center $C_2$ of the cover ring 13 close to the center $C_1$ of the wafer 1. Therefore, according to the present embodiment, the mask deposition can be performed at the optimized position for the wafer 1.

Furthermore, the controller 17 and the adjustment pins 19 of the present embodiment control not the position of the wafer 1 but the position of the cover ring 13. When the adjustment pins 19 contact the wafer 1, the film 2 may be damaged. For example, in the case where the film 2 is the amorphous carbon film, the film 2 is easily separated when the adjustment pins 19 contact the film 2 or the vicinity of the film 2. According to the present embodiment, since the adjustment pins 19 contact not the wafer 1 but the cover ring 13, the film 2 can be prevented from being damaged. Furthermore, in the case where the wafer 1 includes a back face film, the back face film may be rubbed against the stage 11 and may be separated when the adjustment pins 19 contact the wafer 1 and move the wafer 1. According to the present embodiment, since the adjustment pins 19 move not the wafer 1 but the cover ring 13, the back face film can be prevented from being separated.

Figure 2A:
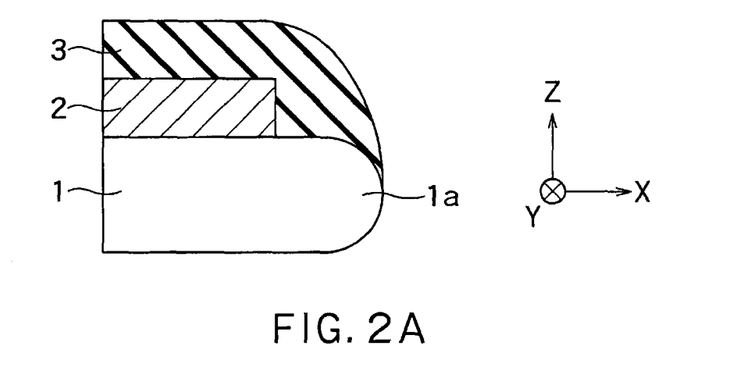
FIGS. 2A to 2C are sectional views illustrating a preferred processing example and non-preferred examples of a wafer of the first embodiment.
Figure 2B:
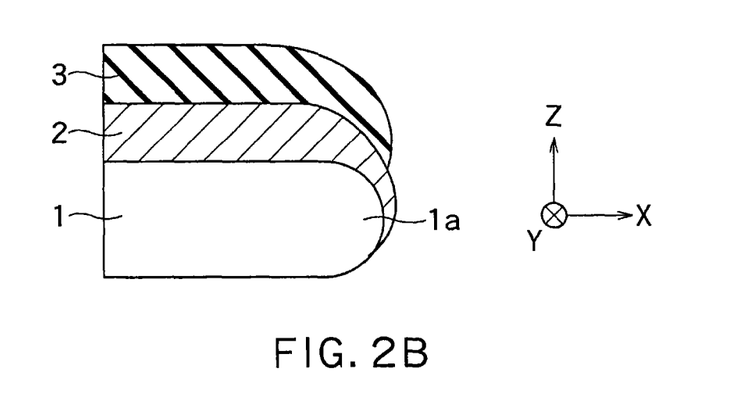
Figure 2C:
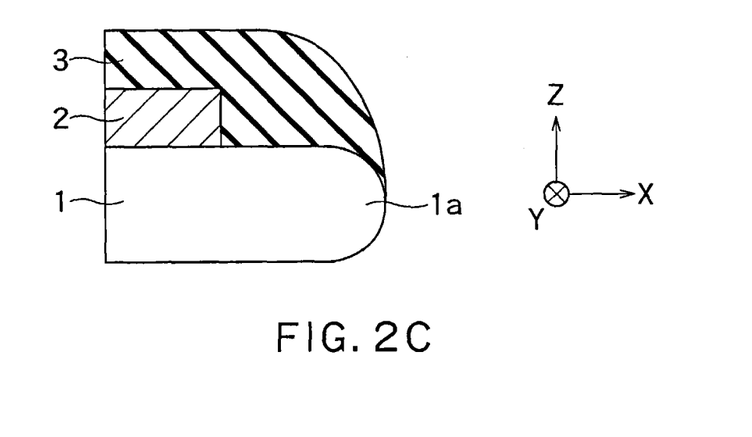

FIGS. 2A to 2C are sectional views illustrating a preferred processing example and non-preferred examples of the wafer 1 of the first embodiment.

FIG. 2A is the preferred processing example of the wafer 1. FIG. 2A illustrates the wafer 1, the film 2 formed on the wafer 1 by the mask deposition, and a film 3 formed so as to cover the film 2 on the wafer 1. An example of the film 3 is a mask member or the like in order to process the film 2.

FIGS. 2B and 2C illustrate the non-preferred processing examples of the wafer 1. The film 2 on the wafer 1 in FIG. 2B is formed up to the bevel 1a. In this case, when ashing is applied to the film 2 formed at the bevel 1a, the film 3 formed at the bevel 1a is separated and the film 3 may become a dust source. On the contrary, the film 2 on the wafer 1 in FIG. 2C is not formed even at an inner-side area of the bevel 1a. In this case, the film 2 may not be formed in an area where processing is required.

According to the present embodiment, the film 2 illustrated in the states of FIGS. 2B and 2C is prevented from being formed by optimizing the positional relation between the bevel 1a and the cover ring 13.

Figure 3:
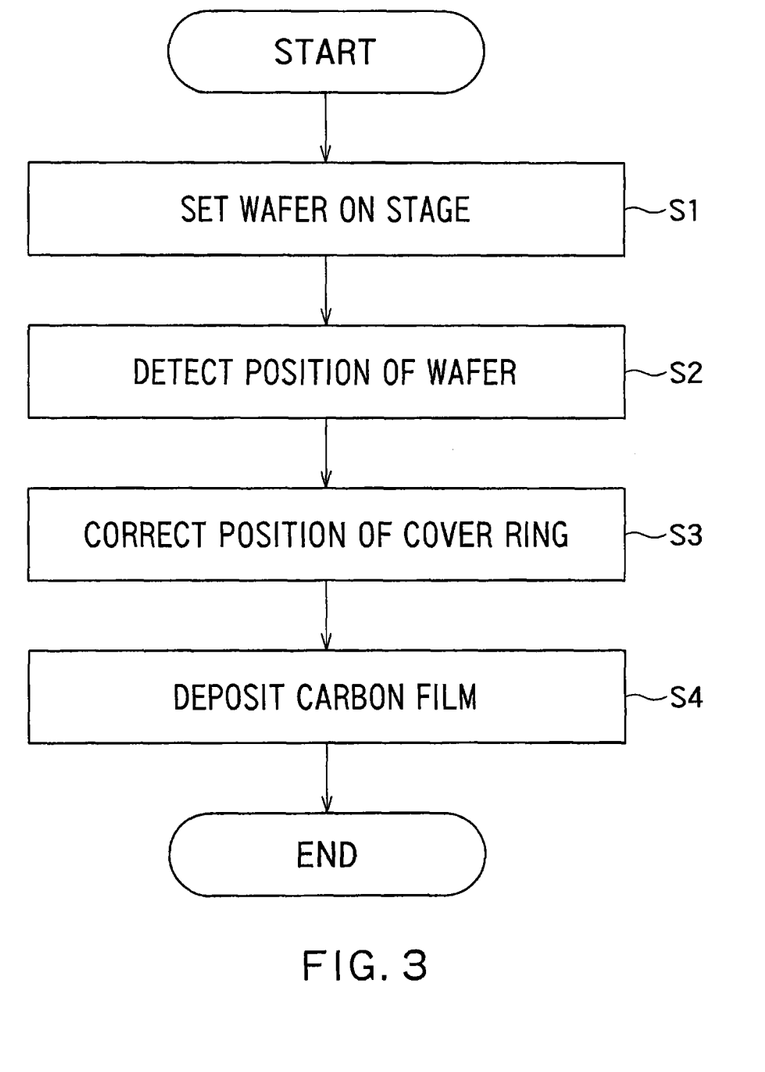
FIG. 3 is a flowchart illustrating a semiconductor manufacturing method of the first embodiment.

FIG. 3 is a flowchart illustrating a semiconductor manufacturing method of the first embodiment.

First, the wafer 1 is conveyed into a chamber of the semiconductor manufacturing apparatus, and the wafer 1 is set on the stage 11 in the chamber (Step S1). The wafer 1 of the present embodiment is set on the stage 11 via the weight sensors 18.

Next, the controller 17 receives the weights of the wafer 1 detected by the weight sensors 18, and detects (calculates) the position of the gravity center of the wafer 1 based on the received weights of the wafer 1 (Step S2).

Next, the controller 17 corrects the position of the cover ring 13 by the adjustment pins 19 based on the detected position of the gravity center of the wafer 1 (Step S3). More specifically, the controller 17 moves the cover ring 13 such that the center $C_2$ of the cover ring 13 matches the gravity center of the wafer 1.

Next, the film 2 is deposited on the wafer 1 in the state that the bevel is of the wafer 1 is covered with the cover ring 13 (Step S4). The film 2 is, for example, the amorphous carbon film.

In this manner, the film 2 is formed by the mask deposition. After that, the film 3 may be formed on the wafer 1 via the film 2.

As described above, according to the present embodiment, the position of the cover ring 13 is controlled based on the detection result of the position of the wafer 1 set on the stage 11, thereby achieving to stabilize the position of the mask deposition for the wafer 1.

Second Embodiment

Figure 4:
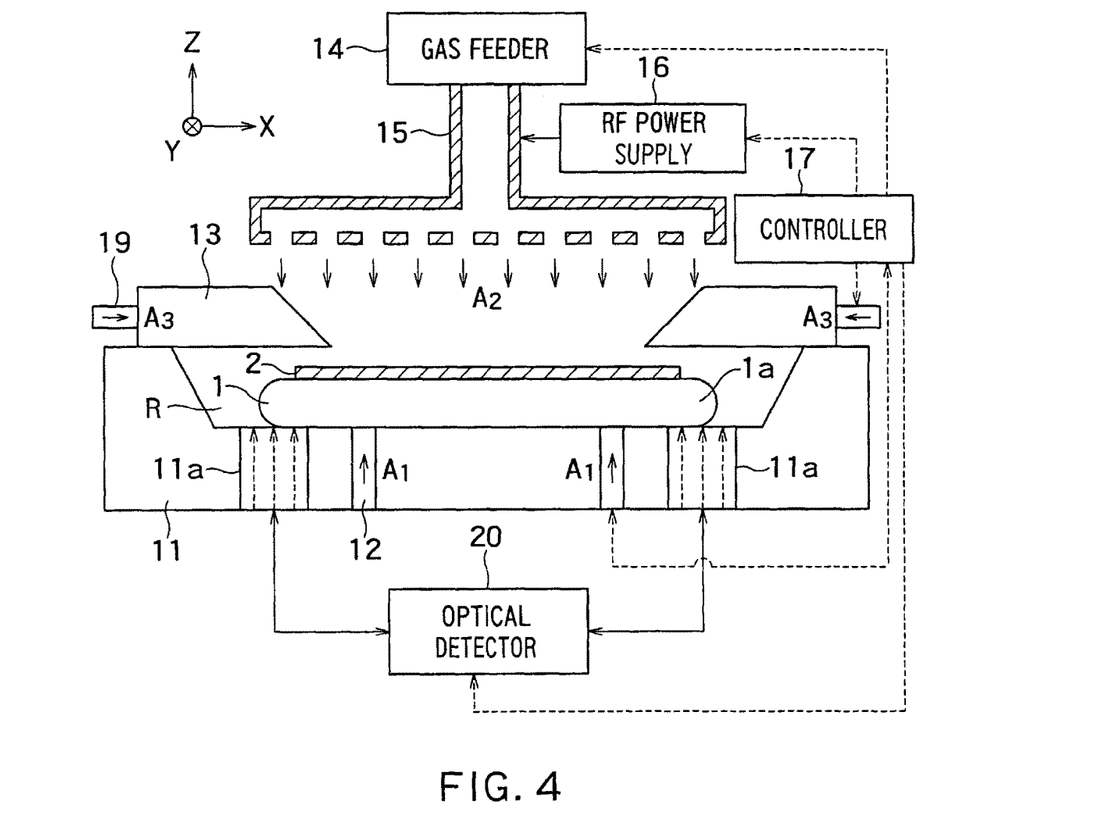
FIG. 4 is a sectional view illustrating a configuration of a semiconductor manufacturing apparatus of a second embodiment.

FIG. 4 is a sectional view illustrating a configuration of a semiconductor manufacturing apparatus of a second embodiment.

As illustrated in FIG. 4, the semiconductor manufacturing apparatus of the present embodiment has the configuration similar to that of the semiconductor manufacturing apparatus of the first embodiment. The semiconductor manufacturing apparatus of the present embodiment includes an optical detector 20 instead of the weight sensors 18.

The stage 11 of the present embodiment includes a plurality of grooves 11a for light propagation between an upper face and a lower face of the stage 11. These grooves 11a may be filled with transparent members. The optical detector 20 of the present embodiment optically detects the position of the wafer 1. More specifically, the optical detector 20 emits light to multiple places on the lower face of the wafer 1 through the grooves 11a, and the position of the wafer 1 can be detected by detecting reflection light of the light from the grooves 11a.

The optical detector 20 of the present embodiment detects the position of the wafer 1 on a principle described below. Light reflectivity at the wafer 1 changes at the bevel 1a of the wafer 1. Therefore, the optical detector 20 can detect the position of the bevel 1a by a change of reflection light strength. Furthermore, the optical detector 20 detects the positions of the bevel 1a at three or more places, thereby achieving to detect (calculate) a position of a center $C_1$ of the wafer 1. After that, the optical detector 20 outputs, to the controller 17, a signal including a detection result of the position of the center $C_1$ of the wafer 1.

The controller 17 may perform, on behalf of the optical detector 20, the processing of calculating the position of the center $C_1$ of the wafer 1 based on the position of the bevel 1a. In this case, the optical detector 20 outputs, to the controller 17, a signal including a detection result of the position of the bevel 1a.

The controller 17 of the present embodiment controls the position of the cover ring 13 based on the detected position of the center $C_1$ of the wafer 1. More specifically, the controller 17 moves the cover ring 13 such that a center $C_2$ of the cover ring 13 matches the center $C_1$ of the wafer 1. At this point, the controller 17 drives the adjustment pins 19 as indicated by arrows $A_3$, and the position of the cover ring 13 can be controlled by pushing the cover ring 13 with the adjustment pins 19.

According to the present embodiment, the position of the cover ring 13 is controlled based on the detection result of the position of the wafer 1 set on the stage 11 similar to the first embodiment, thereby achieving to stabilize a position of mask deposition for the wafer 1.

Optical detection of the second embodiment has a merit of detecting the position of the wafer 1 with high accuracy, compared to weight detection of the first embodiment. On the other hand, in the optical detection of the second embodiment, there may be a case where light is hardly detected when a light receiving portion of the optical detector 20 is contaminated by the film 2. However, in the weight detection of the first embodiment, such a contamination problem can be avoided.

The flowchart in FIG. 3 is also applicable to the second embodiment by replacing the weight detection in Step S2 with the optical detection.

Third Embodiment

Figure 5:
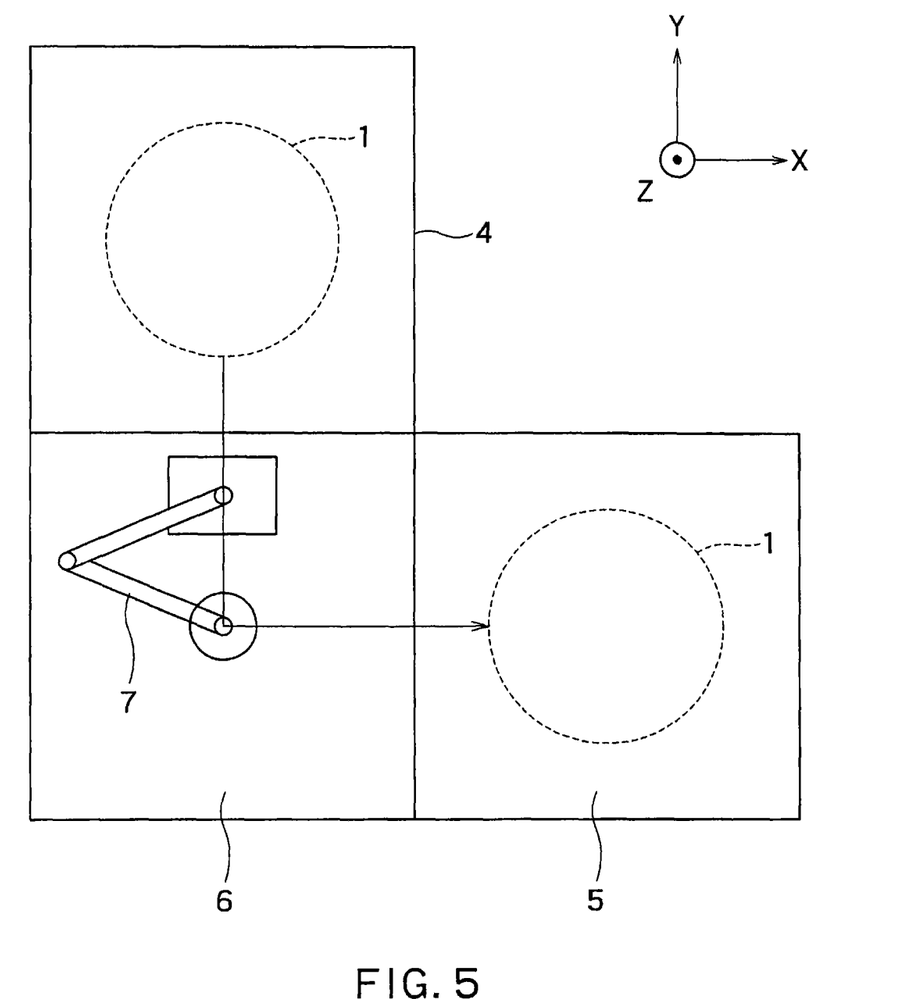
FIG. 5 is a top view schematically illustrating a configuration of a semiconductor manufacturing apparatus of a third embodiment.

FIG. 5 is a top view schematically illustrating a configuration of a semiconductor manufacturing apparatus of a third embodiment.

The semiconductor manufacturing apparatus of the present embodiment includes a deposition chamber 4 configured to form a film 2 on a wafer 1 by deposition processing, and an etching chamber 5 configured to remove the film 2 formed on the wafer 1 by etching processing. The deposition chamber 4 and the etching chamber 5 are respectively examples of a film forming chamber and a film removing chamber.

The semiconductor manufacturing apparatus of the present embodiment further includes a conveyance room 6 in communication with the deposition chamber 4 and the etching chamber 5, and a conveyance robot 7 disposed in the conveyance room 6 and configured to convey the wafer 1 to the deposition chamber 4 and the etching chamber 5. The conveyance robot 7 is an example of a conveyance module. According to the present embodiment, the deposition processing and etching processing for the wafer 1 can be performed in the same semiconductor manufacturing apparatus without taking out the wafer 1 from the semiconductor manufacturing apparatus.

Figure 6A:
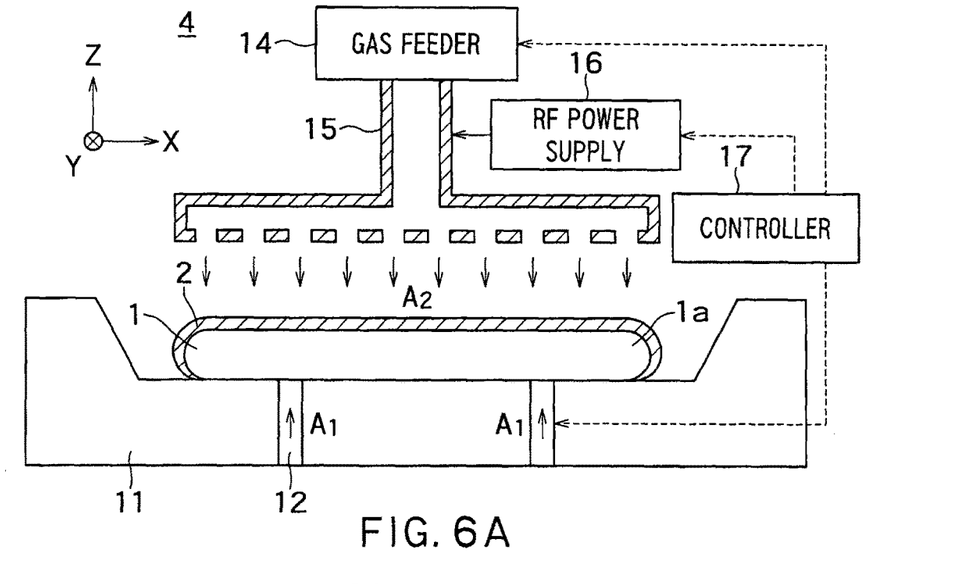
FIGS. 6A and 6B are sectional views illustrating configurations of a deposition chamber and an etching chamber of the third embodiment.
Figure 6B:
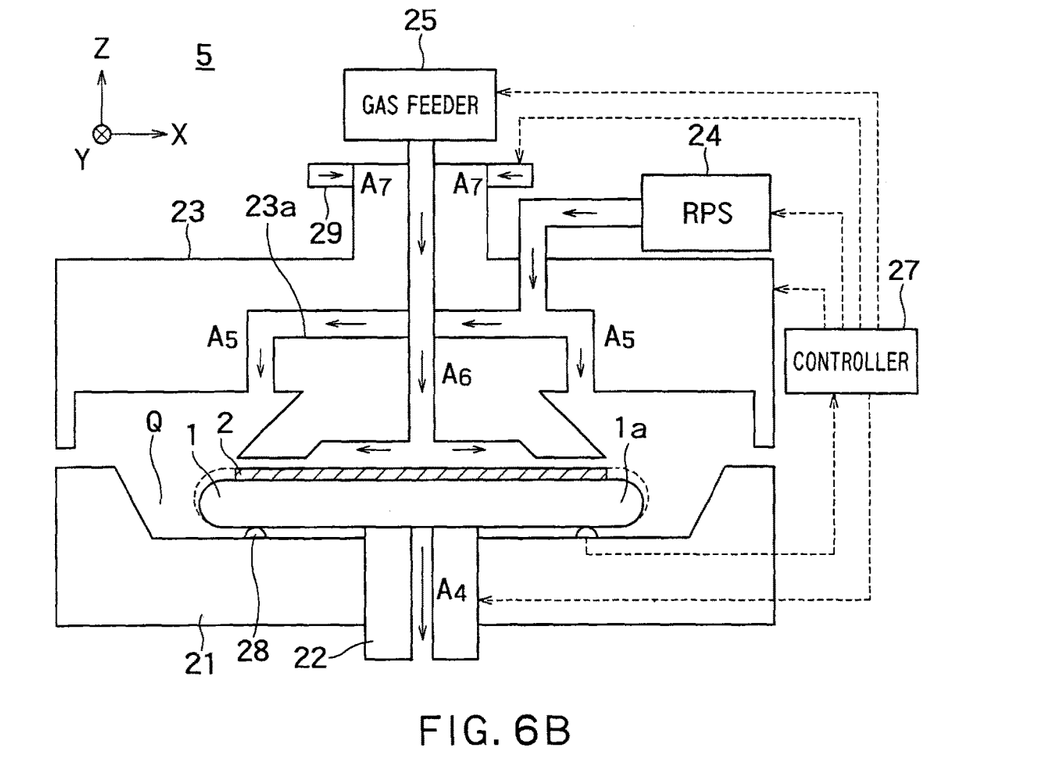

FIGS. 6A and 6B are sectional views illustrating configurations of the deposition chamber 4 and the etching chamber 5 of the third embodiment.

As illustrated in FIG. 6A, the deposition chamber 4 includes a stage 11, lift pins 12, a gas feeder 14, an upper electrode 15, an RF power supply 16 and a controller 17 as similar to the semiconductor manufacturing apparatuses of the first and second embodiments, but does not include a cover ring 13, weight sensors 18 and adjustment pins 19. Therefore, in the deposition chamber 4, the film 2 is formed on a surface of the wafer 1 including a bevel 1a.

As illustrated in FIG. 6B, the etching chamber 5 includes a stage 21, a vacuum chuck 22, an upper cover 23, a remote plasma system (RPS) 24, a gas feeder 25, a controller 27, a plurality of weight sensors 28 and a plurality of adjustment pins 29. The stage 21 and the upper cover 23 are respectively examples of a wafer setting module and a cover module. The controller 27, the weight sensors 28 and the adjustment pins 29 are an example of a position controller. The weight sensors 28 and the adjustment pins 29 are respectively examples of a weight detector and a pressing member. The RPS 24, the gas feeder 25 and the controller 27 are an example of a film removing module.

[Stage 21]

The stage 21 is used to set the wafer 1 formed with the film 2. FIG. 6B illustrates the wafer 1 set on an upper face side of the stage 21 via the weight sensors 28. The stage 21 has functions similar to those of the stage 11.

[Vacuum Chuck 22]

The vacuum chuck 22 is used to chuck the wafer 1 on the stage 21. According to the present embodiment, a back face of the wafer 1 is vacuumed by the vacuum chuck 22 as indicated by an arrow $A_4$, thereby suppressing movement of the wafer 1.

[Upper Cover 23]

The upper cover 23 is used to cover a portion of the wafer 1 set on the stage 21, more specifically, used to cover a portion excluding the bevel 1a of the wafer 1. Therefore, the upper cover 23 can cover the wafer 1 such that the film 2 formed at the bevel 1a of the wafer 1 is exposed. The upper cover 23 of the present embodiment includes a lid portion 23a to cover the portion excluding the bevel 1a of the wafer 1. The lid portion 23a of the present embodiment has a circular flat shape.

The semiconductor manufacturing apparatus of the present embodiment removes the film 2 formed on the wafer 1 in a state that the portion excluding the bevel 1a of the wafer 1 is covered with the upper cover 23 as illustrated in FIG. 6B. This can remove the film 2 formed at the bevel 1a while retaining the film 2 formed at the portion excluding the bevel 1a. In FIG. 6B, the removed film 2 is indicated by dashed lines. As described above, the semiconductor manufacturing apparatus of the present embodiment can perform bevel etching for the wafer 1.

The stage 21 of the present embodiment includes a play area Q in the vicinity of the bevel 1a of the wafer 1 in order to facilitate conveyance of the wafer 1. Therefore, the wafer 1 of the present embodiment may move on the stage 21 before being chucked by the vacuum chuck 22 because of the play area Q. Further, a center of the wafer 1 of the present embodiment may be deviated from a center of the stage 21 because of the play area Q. In such cases, there may be a problem that a positional relation between the bevel 1a and the upper cover 23 becomes unstable and a position of the bevel etching becomes unstable. However, according to the present embodiment, the above problem may be solved by a method described later.

[RPS 24]

The RPS 24 supplies radicals and ions to the wafer 1 set on the stage 21 to remove the film 2 from the wafer 1 by the radicals and ions. Examples of the radicals are oxygen radicals and nitrogen trifluoride radicals. These radicals can be used, for example, in the case where the film 2 is an amorphous carbon film.

The radicals and ions from the RPS 24 are passed through a flow path in the upper cover 23 as indicated by arrows $A_5$, and then discharged from an outlet port of the upper cover 23 to the wafer 1. The outlet port is provided on an outer side of the lid portion 23*a* of the upper cover 23. Therefore, the radicals and ions are mainly supplied only to the vicinity of the bevel is of the wafer 1, and supply of the radicals and ions to other portions of the wafer 1 is stopped by the lid portion 23*a*. Therefore, the RPS 24 of the present embodiment can remove the film 2 formed at the bevel 1*a* while retaining the film 2 formed at the portion excluding the bevel 1*a*.

Supply of the radicals and ions to the portion excluding the bevel 1*a* of the wafer 1 is stopped not only by the lid portion 23*a* but also by a purge gas described later.

[Gas Feeder 25]

The gas feeder 25 supplies the purge gas to a surface of the film 2 at the time of removing the film 2 formed on the wafer 1. Examples of the purge gas are inactive gases such as nitrogen ($N_2$) gas and halogen gas.

The purge gas from the gas feeder 25 is passed through a path in the upper cover 23 as indicated by an arrow $A_6$, and discharged from the outlet port of the upper cover 23 to the wafer 1. The outlet port is provided at a lower face of the lid portion 23*a*.

The purge gas is supplied so as to stop the radicals and ions from reaching the surface of the film 2 separated from the bevel 1*a*. As a result, the radicals and ions are mainly supplied to the film 2 in the vicinity of the bevel 1*a*. Therefore, according to the present embodiment, the film 2 formed at the bevel 1*a* can be removed while retaining the film 2 formed at the portion other than the bevel 1*a*.

[Controller 27]

The controller 27 controls various kinds of operation of the semiconductor manufacturing apparatus. The controller 27 controls, for example, operation of the vacuum chuck 22, movement of the upper cover 23, supply of the radicals and ions from the RPS 24, supply of the purge gas from the gas feeder 25 and the like.

The controller 27 further detects a position of the wafer 1 set on the stage 21, and can control a position of the upper cover 23 based on the detected position of the wafer 1. The controller 27 of the present embodiment detects the position of the wafer 1 based on output signals from the weight sensors 28. Further, the controller 27 of the present embodiment controls the position of the upper cover 23 by using the adjustment pins 29. The above control by the controller 27 will be described in detail later.

[Weight Sensors 28]

The weight sensors 28 are disposed on the upper face side of the stage 21. Therefore, the wafer 1 of the present embodiment is set on the stage 21 via the weight sensors 28. The weight sensors 28 have functions similar to those of the weight sensors 18.

[Adjustment Pins 29]

The adjustment pins 29 contact an outer periphery of projected portions provided at the upper cover 23. The adjustment pins 29 are used to adjust the position of the upper cover 23. The adjustment pins 29 have functions similar to those of the adjustment pins 19.

The controller 27 of the present embodiment preliminarily holds coordinate data of the weight sensors 28 in a storage. Further, the controller 27 of the present embodiment calculates (detects) a position of gravity center of the wafer 1 based on weights of the wafer 1 detected by the weight sensors 28 and the coordinate data of the weight sensors 28 held in the storage.

Further, the controller 27 of the present embodiment controls the position of the upper cover 23 based on the detected position of the gravity center of the wafer 1. More specifically, the controller 27 moves the upper cover 23 such that the center of the upper cover 23 matches the gravity center of the wafer 1. At this point, the controller 27 drives the adjustment pins 29, and the upper cover 23 is pushed by the adjustment pins 29 as indicated by arrows $A_7$, thereby achieving to control the position of the upper cover 23.

Figure 7:
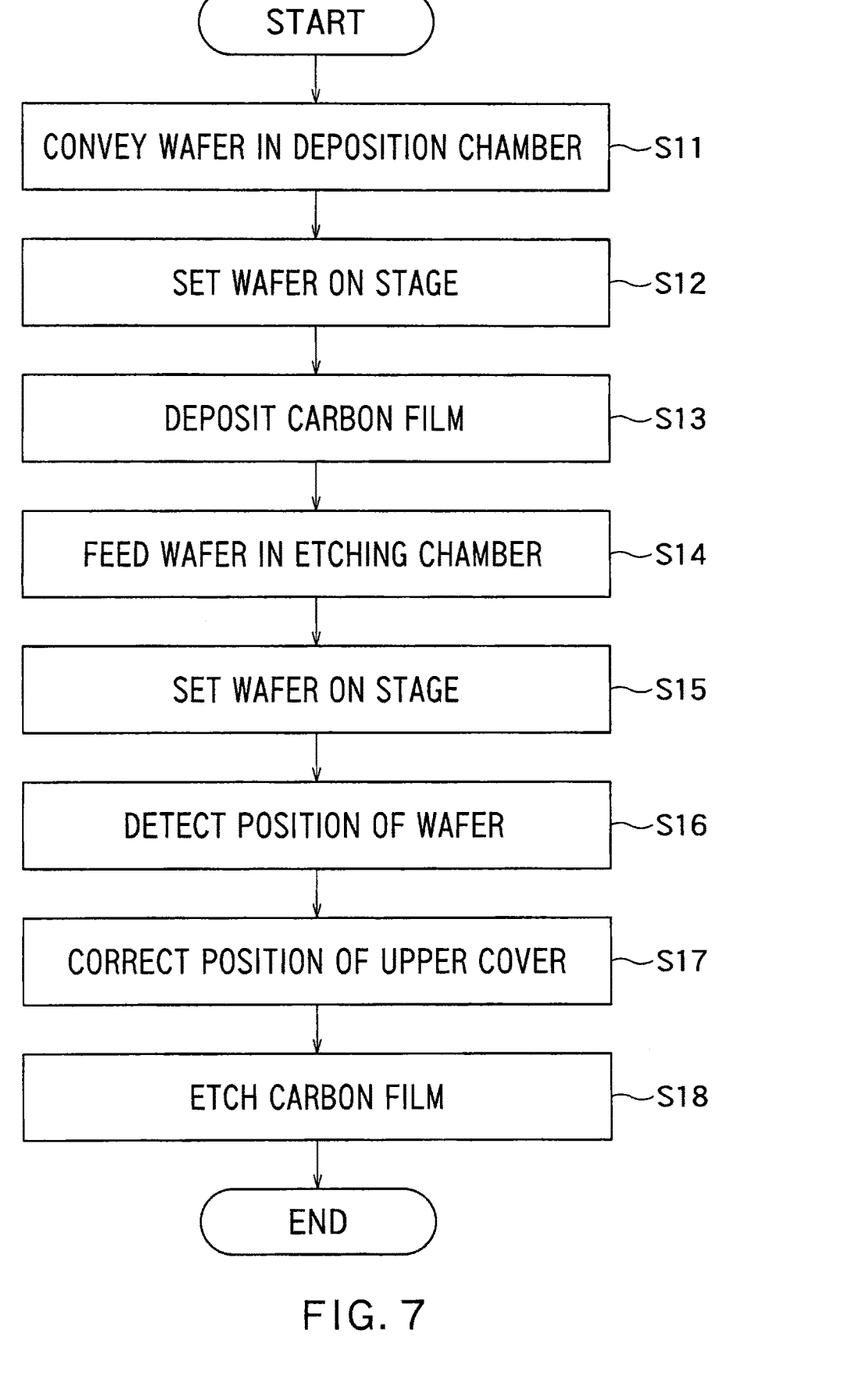
FIG. 7 is a flowchart illustrating a semiconductor manufacturing method of the third embodiment.

FIG. 7 is a flowchart illustrating a semiconductor manufacturing method of the third embodiment.

First, the wafer 1 is conveyed into the deposition chamber 4 from the conveyance room 6 (Step S11). Next, the wafer 1 is set on the stage 11 in the deposition chamber 4 (Step S12). Then, the film 2 is deposited on the wafer 1 in the deposition chamber 4 (Step S13). The film 2 is, for example, the amorphous carbon film.

Next, the wafer 1 is conveyed into the conveyance room 6 from the deposition chamber 4, and then the wafer 1 is conveyed into the etching chamber 5 from the conveyance room 6 (Step S14). Then, the wafer 1 is set on the stage 21 in the etching chamber 5 (Step S15). The wafer 1 of the present embodiment is set on the stage 21 via the weight sensors 28.

Next, the controller 27 receives the weights of wafer 1 detected by the weight sensors 28, and detects (calculates) the position of the gravity center of the wafer 1 based on the received weights of the wafer 1 (Step S16).

Then, the controller 27 corrects the position of the upper cover 23 by the adjustment pins 29 based on the detected position of the gravity center of the wafer 1 (Step S17). More specifically, the controller 27 moves the upper cover 23 such that the center of the upper cover 23 matches the gravity center of the wafer 1.

Next, the film 2 formed on the wafer 1 is etched in the state that the portion excluding the bevel 1*a* of the wafer 1 is covered with the upper cover 23 (Step S18).

In this manner, the film 2 applied with the bevel etching is formed. After that, a film 3 may be formed on the wafer 1 via the film 2.

According to the present embodiment, the position of the upper cover 23 is controlled based on a detection result of the position of the wafer 1 set on the stage 21 similar to the first and second embodiments, thereby achieving to stabilize the position of the bevel etching for the wafer 1.

Furthermore, the controller 27 and the adjustment pins 29 of the present embodiment control not the position of the wafer 1 but the position of the upper cover 23. Therefore, according to the present embodiment, the film 2 can be prevented from being damaged by the adjustment pins 29.

The weight sensors 28 of the present embodiment may be replaced with the optical detector 20 of the second embodiment. In this case, in the flowchart of FIG. 7, weight detection in Step S16 can be replaced with optical detection.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a wafer setting module on which a wafer is to be set;
   a cover module configured to cover a portion of the wafer set on the wafer setting module; and
   a position controller configured to detect a position of a center or a gravity center of the wafer set on the wafer setting module and control a position of the cover module based on the detected position of the center or the gravity center of the wafer,
   wherein the position controller is configured to control the position of the cover module by bringing a plurality of pressing members into contact with the cover module without bringing the plurality of pressing members into contact with the wafer to move the cover module in a direction parallel to an upper face of the wafer.

2. The apparatus of claim 1, wherein
   the position controller comprises a plurality of weight detectors provided on the wafer setting module, the wafer being to be set on the wafer setting module via the weight detectors, and
   the position controller detects the position of the gravity center of the wafer based on weights of the wafer detected by the weight detectors.

3. The apparatus of claim 1, wherein the position controller controls the position of the cover module by pushing the cover module with the plurality of pressing members.

4. The apparatus of claim 1, wherein the cover module has a ring shape to cover an end portion of the wafer.

5. The apparatus of claim 1, further comprising a film forming module configured to form a film on the wafer in a state where the portion of the wafer is covered with the cover module.

6. The apparatus of claim 1, wherein the cover module covers the wafer so as to expose a film formed at an end portion of the wafer.

7. The apparatus of claim 1, further comprising a film removing module configured to remove a film formed on the wafer in a state where the portion of the wafer is covered with the cover module.

8. The apparatus of claim 1, comprising:
   a film forming chamber configured to form a film on the wafer;
   a film removing chamber configured to remove the film formed on the wafer; and
   a conveyance module provided in a conveyance room which is communicated with the film forming chamber and the film removing chamber, and configured to convey the wafer to the film forming chamber and the film removing chamber,
   wherein the wafer setting module and the cover module are provided in the film removing chamber.

9. The apparatus of claim 1, wherein the position controller controls the position of the cover module based on the detected position of the center or the gravity center of the wafer and a position of a center of the cover module, and
   the position controller controls the position of the cover module by moving the center of the cover module in the direction parallel to the upper face of the wafer without moving the center or the gravity center of the wafer such that the position of the center of the cover module matches the detected position of the center or the gravity center of the wafer.

10. The apparatus of claim 1, wherein the position controller comprises an optical detector configured to optically detect the position of the center of the wafer.

11. The apparatus of claim 10, wherein the optical detector detects the position of the center of the wafer by emitting light to a plurality of places on a lower face of the wafer.

* * * * *